(12) United States Patent
Andersen et al.

(10) Patent No.: US 6,404,566 B1
(45) Date of Patent: Jun. 11, 2002

(54) APPARATUS AND METHOD FOR ASSEMBLING OPTICAL DEVICES

(75) Inventors: Bo A. M. Andersen, Bridgewater, NJ (US); Mindaugas F. Dautartas, Alburtis, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/542,937

(22) Filed: Apr. 4, 2000

(51) Int. Cl.[7] .................................................. G02B 7/02
(52) U.S. Cl. ........................................ 359/819; 359/811
(58) Field of Search ................................. 359/819, 811, 359/815

(56) References Cited

U.S. PATENT DOCUMENTS

| | | | | |
|---|---|---|---|---|
| 5,457,063 A | * | 10/1995 | Park | 437/52 |
| 5,563,683 A | * | 10/1996 | Kamiya | 355/53 |
| 5,681,362 A | * | 10/1997 | Waind | 51/298 |
| 5,838,703 A | | 11/1998 | Lebby et al. | 372/43 |
| 5,905,750 A | | 5/1999 | Lebby et al. | 372/50 |
| 5,930,057 A | | 7/1999 | Sechrist et al. | 359/822 |
| 6,223,103 B1 | * | 5/2001 | Ikeda | 359/819 |

* cited by examiner

Primary Examiner—Georgia Epps
Assistant Examiner—Saeed Seyrafi
(74) Attorney, Agent, or Firm—Dickstein Shapiro Morin & Oshinsky LLP

(57) ABSTRACT

A method and apparatus for mounting optical elements onto an optical device are described. A mounting structure is produced out of a carrier substrate. The mounting structure includes one or more walls defining a well and surrounding a plurality of protrusions. The well defined by the walls is filled with an adhesive material system, such as epoxy. An optical device is lowered into contact with the epoxy, and then into contact with the protrusions. The displaced epoxy is displaced through one or more conduits into one or more reservoirs. A plurality of such mounting structures enables one to align a plurality of optical elements together in a single plane.

42 Claims, 5 Drawing Sheets

APPARATUS AND METHOD FOR ASSEMBLING OPTICAL DEVICES

FIELD OF THE INVENTION

The invention generally relates to optical devices and their fabrication, and more particularly to an apparatus and method for precisely controlling the angular relationship between optical elements and a substrate plane within an optical device.

BACKGROUND

Optical filters are well known for use with optical devices, such as, for example, hybrid optical components. Conventional assembly methodologies for constructing optical devices, such as hybrid optical components, are generally designed such that optical elements are mounted in a single structural plane. Specifically, optic:al elements such as mirrors, filters, polarizers, beam splitters, lenses and other reflective or transmissive optical elements within the optical device are positioned and bonded in a single plane on a substrate surface. It is important to properly align the optical filters and other optical elements along the structural plane so that optical signal is not lost through improper transmission from one optical element to another.

Conventionally, optical elements utilized in optical devices have been epoxied or otherwise affixed to a substrate surface. Referring to FIGS. 1–3, an optical device 10 is shown having a carrier substrate 12. The optical device 10 has an optical input point 14 and an optical output point 40 positioned in the same structural plane. Further mounted on the carrier substrate 12 are a first optical element 18, a second optical element 28, and a third optical element 34, all mounted in the same structural plane. The optical elements 18, 28, 34 may be any reflective or transmissive optical elements, such as lenses, mirrors, polarizers, beam splitters, filters, or other like optical elements.

The first optical element 18 has a first surface 20 (FIG. 2), a second surface 22, and a reflecting surface 24. By design, optical signals from the input point 14 are to travel along a first signal pathway 16 and be reflected off of the reflecting surface 24 toward the second optical element 28. The reflected optical signals travel along a second signal pathway 26 and reflect off of a reflecting surface 30 of the second optical element 28. The twice reflected optical signals then travel along a third signal pathway 32 and are reflected off of a reflecting surface 36 of the third optical element 34 into a fourth signal pathway 38 leading to the output point 40.

In practice, as noted above, the optical elements 18, 28, 34 generally are affixed to the carrier substrate 12 through an epoxy 42. Specifically, as shown in FIG. 2, the epoxy 42 is deposited on a first surface 13 of the carrier substrate 12 and the optical elements 18, 28, 34 are each lowered into contact with the epoxy 42. Often, however, in lowering an optical element to be bonded to the carrier substrate 12, the optical element does not bond with the carrier substrate 12 such that the first surface 20 is parallel to the first surface 13. As illustrated in FIG. 3, the first optical element 18 has been lowered onto the epoxy 42, but remains at an angle to the first surface 13 of the carrier substrate 12. Improper alignment of the optical elements 18, 28, 34 leads to the transmission of optical signals out of the structural plane, thereby preventing the optical signals from reaching the output point 40.

SUMMARY

The invention provides a mounting structure for mounting an optical element. The mounting structure includes a substrate having a first surface, a plurality of protrusions extending by a substantially equal amount from the substrate first surface, and one or more walls extending from the substrate first surface and surrounding the protrusions and defining a well.

The invention further provides an optical device which includes a substrate having a first surface, at least one mounting structure, and at least one optical element mounted on protrusions of the at least one mounting structure.

The invention further provides a method of mounting one or more optical elements onto an optical device having one or more mounting structures which include a plurality of protrusions surrounded by one or more walls defining a space. The method includes the steps of adding an epoxy material to the space, lowering the optical element into contact with the epoxy material, contacting the optical element to the protrusions, and curing the epoxy material.

The invention further provides a method of planarly aligning two or more optical elements mounted onto an optical device having two or more mounting structures which include a plurality of protrusions surrounded by one or more walls defining a space. The method includes the steps of adding an epoxy material to the space of each mounting structure, lowering each optical element into contact with the epoxy material in a respective space, contacting each optical element to the protrusions of a respective mounting structure, aligning each optical element to the other optical elements, and curing the epoxy material.

The foregoing and other advantages and features of the invention will be more readily understood from the following detailed description of the invention, which is provided in connection with the accompanying drawings.

DETAILED DESCRIPTION OF THE PREFERRED EMBODIMENTS

Figure 1:
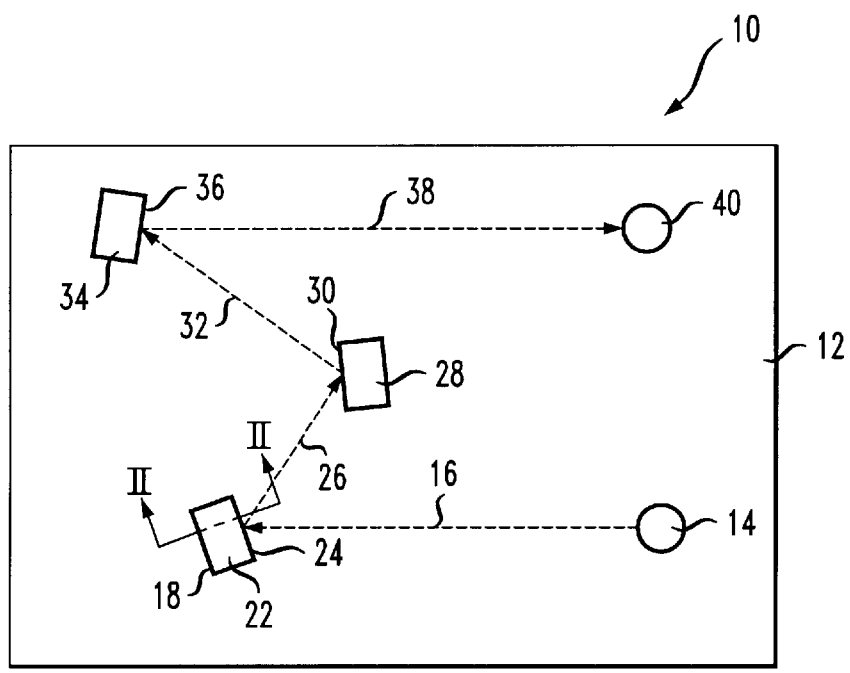
FIG. 1 is a view from the top of a conventional optical device on a carrier substrate.
Figure 2:
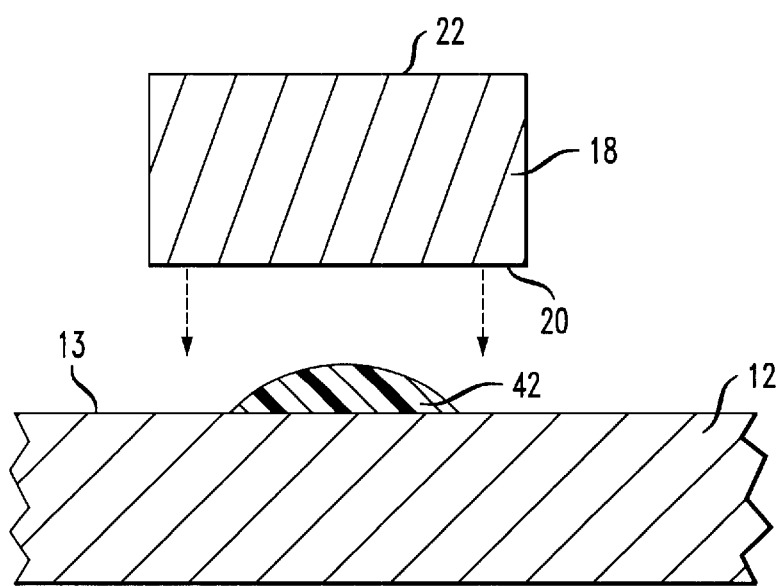
FIG. 2 is a cross-sectional view taken along line II—II of FIG. 1.
Figure 3:
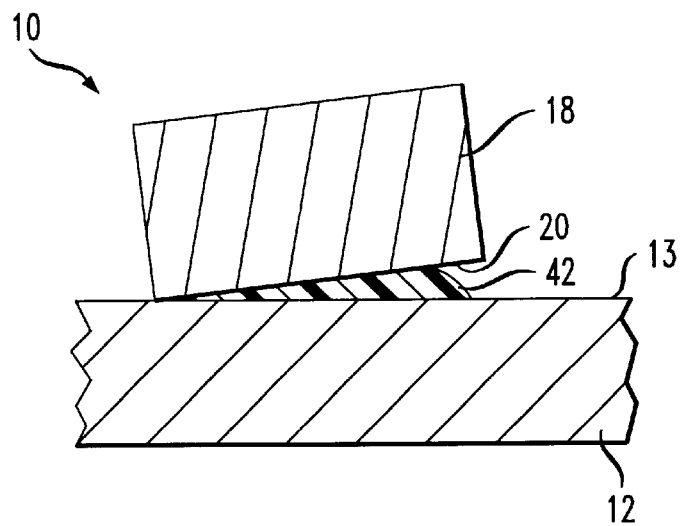
FIG. 3 is another cross-sectional view showing improper alignment of an optical element of the optical device of FIG. 1.

With reference to FIGS. 4–8, there is shown an optical device carrier substrate 100. The optical device carrier substrate 100 has a first surface 102. Located on the first surface 102 is a mounting structure 103 including a generally rectangular well 108 with walls 106 defining a space 109. A plurality of island-like protrusions 104 are positioned within the space 109. Preferably, each of the protrusions 104 extends upwardly the same distance above the first surface 102. In a preferred embodiment, the walls 106 extend to a greater height above the first surface 102 than do the protrusions 104. A pair of reservoirs 112 are positioned at opposite ends of the well 108. Each reservoir 112 is connected to the well 108 through a conduit 114 having walls 116.

Figure 6:
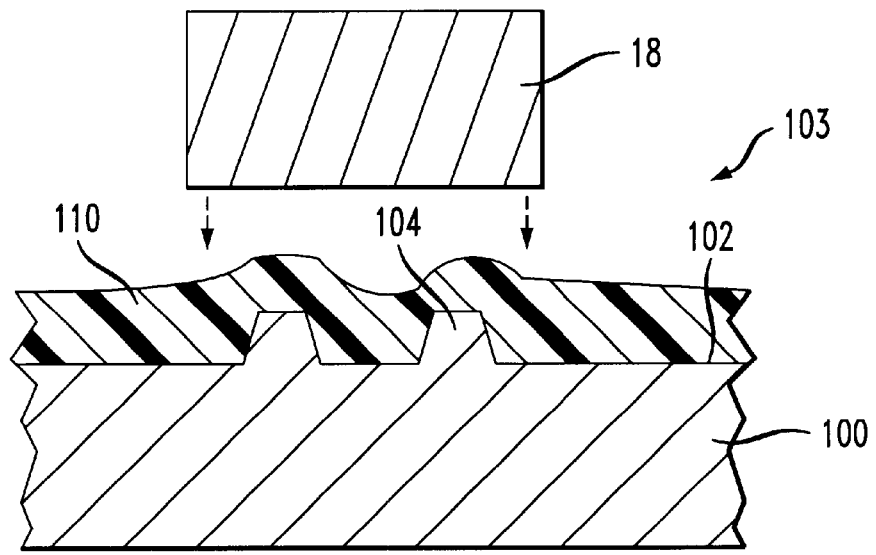
FIG. 6 is another cross-sectional view of the optical element being mounted on the carrier substrate of FIG. 4.
Figure 8:
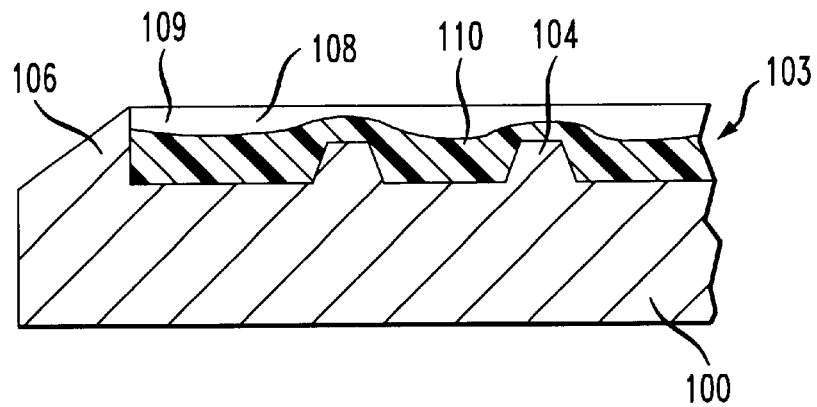
FIG. 8 is a partial cross-sectional view taken along line VIII—VIII of FIG. 4.

A material system 110, which preferably has the characteristics that it efficiently wets a surface, is adhesive, and has weak cohesive forces, is placed within the well 108 filling in the space 109 to at least just above an uppermost extent of the protrusions 104 (FIGS. 6, 8). The efficient wetting surface allows for a thin layer of the adhesive material system 110 to be used to adhere optical elements to the protrusions 104. A preferred embodiment of the adhesive material system 110 is an epoxy, either in liquid or powder form. If in the powder form, the epoxy preferably would have to be subjected to conditions transitioning it into a liquid phase, such as, for example, a temperature or pressure change. Another example of the adhesive material system 110 is a wax-like material. As with the powdered epoxy, a wax-like material preferably would have to be subjected to conditions transitioning it into a liquid phase, such as, for example, a temperature or pressure change.

The conduits 114 allow for the egress of the adhesive material system 110 from the space 109 into the reservoirs 112 during mounting of optical elements, such as the optical elements 18, 28, 34.

Figure 4:
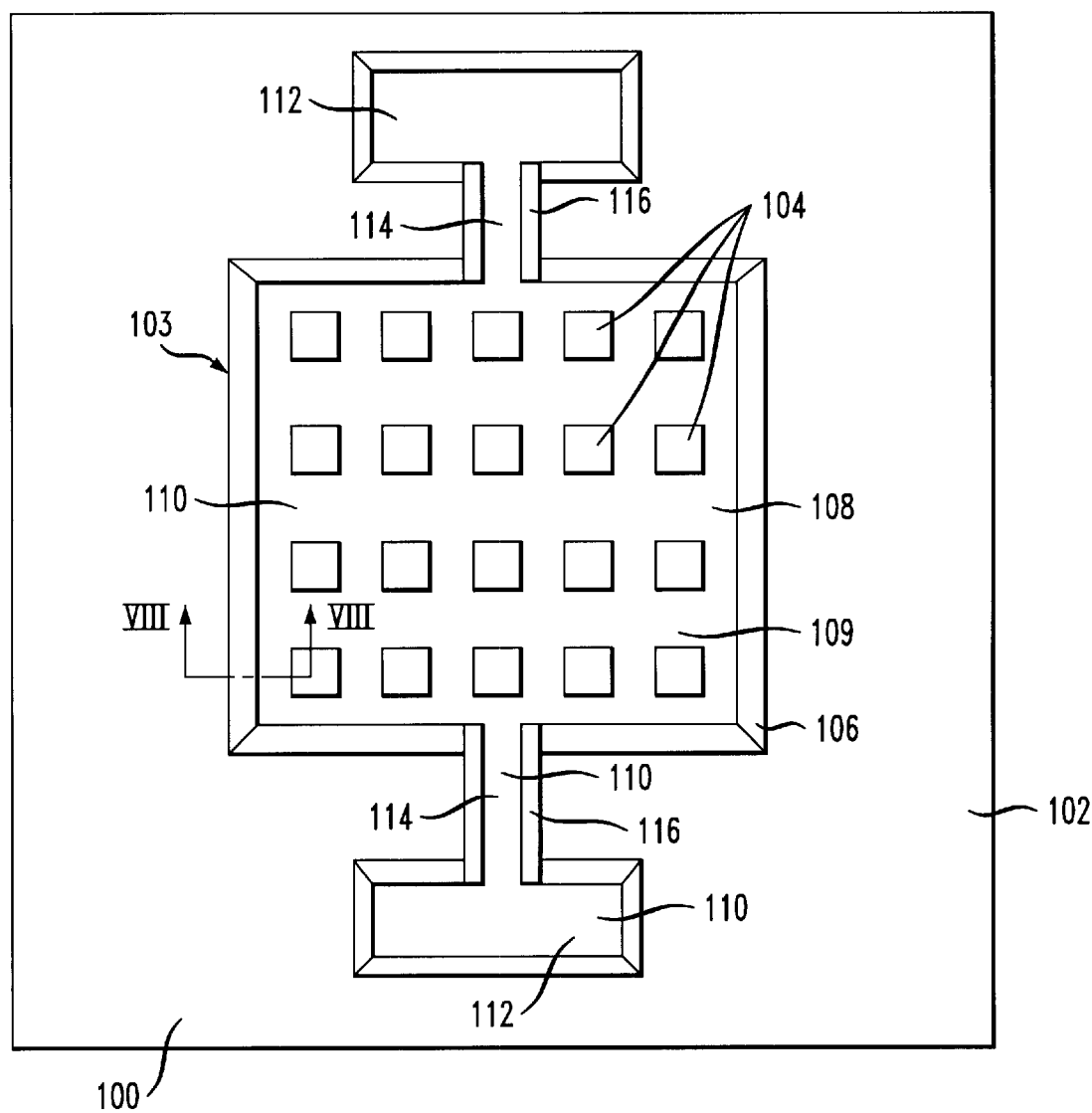
FIG. 4 is a view from the top of an optical device carrier substrate constructed in accordance with an embodiment of the present invention.

The mounting structure 103, namely the protrusions 104, well 108, reservoirs 112, and conduits 114, are preferentially formed through standard anisotropic etching of a substrate, e.g. a semiconductor substrate. The carrier substrate 100 is only partially shown in FIG. 4. Thus, the plurality of protrusions 104 of FIG. 4 are designed to support a single optical element 18, 28, 34. Additionally, structures 103 which are the same as or similar to those shown in FIG. 4 are also provided in the substrate 12 to support other respective ones of the optical elements 18, 28, 34.

The term "substrate" is to be understood as including any material which is capable of supporting an optical element. Industry preferred materials include ceramic, glass, silicon, steel, metal alloys, and diamond.

Figure 5:
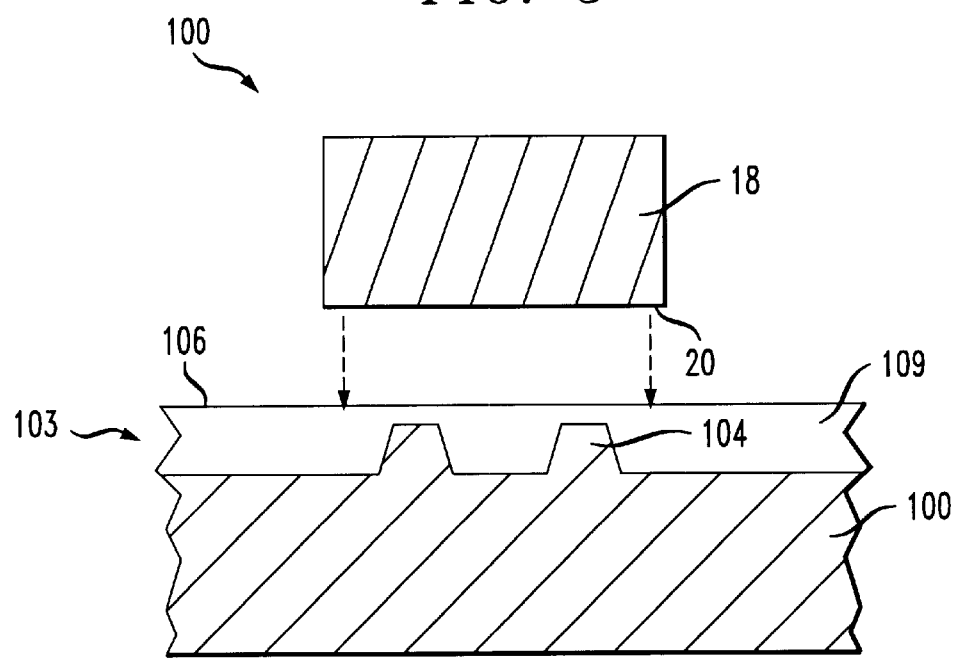
FIG. 5 is a cross-sectional view taken along line V—V of FIG. 4 of an optical element being mounted on the carrier substrate.
Figure 7:
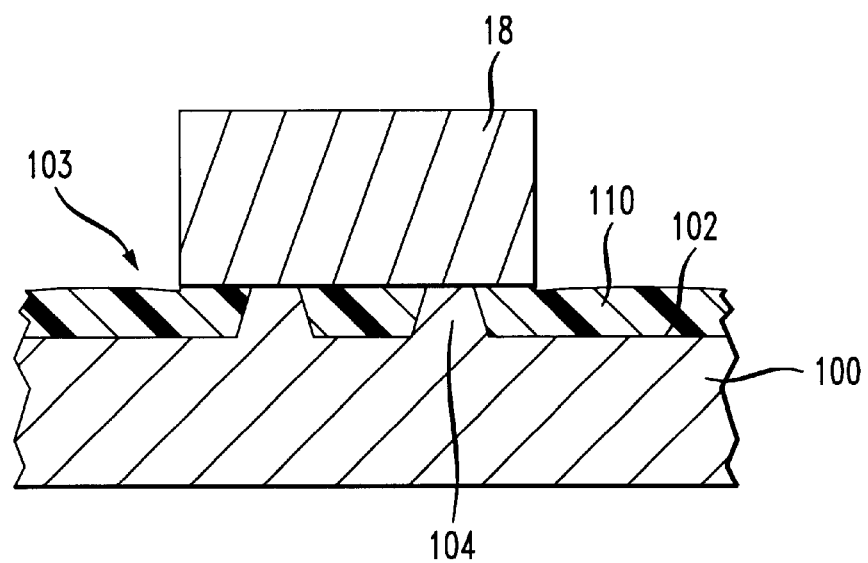
FIG. 7 is another cross-sectional view of the optical device being mounted on the carrier substrate of FIG. 4.
Figure 9:
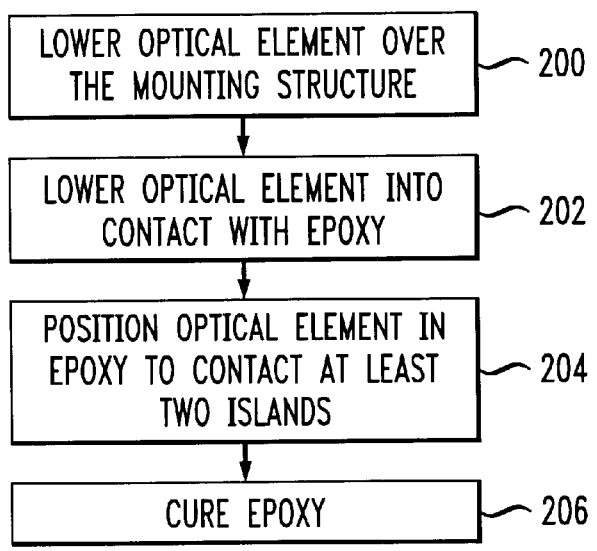
FIG. 9 is a flow diagram of the process of aligning optical elements on a carrier substrate in accordance with an embodiment of the present invention.

The method of mounting optical elements will next be described with reference to FIG. 9, which illustrates the mounting process, and to FIGS. 5–8, which show the structural implementation. At step 200 (FIG. 9), the adhesive material system 110 is added to the space 109 within the walls 106. An optical element, e.g. 18, is then lowered over the mounting structure 103 into the space 109 as shown in FIG. 5. The adhesive material system 110 is omitted from FIG. 5 for clarity of illustration regarding the lowering of the optical element 18. The optical element 18 is further lowered until it comes in contact with the adhesive material system 110 at step 202 (FIGS. 6, 7, 9). Once in contact with the material system 110, at step 204 the optical element 18 is positioned to contact at least two protrusions 104 (FIGS. 7, 9). As noted above, however, the illustrated mounting structure 103, which includes more than two protrusions 104, is configured to receive a single optical element. The volume of the optical element 18 will displace an equal volume of the adhesive material system 110, forcing the adhesive material system 110 through the conduits 114 into the reservoirs 112. At step 206, the adhesive material system 110 is cured. With a proper formulation of the material system 110 and a proper drying temperature, the adhesive material system 110 preferably will tend to decrease its volume through curing and cooling, thereby forcing the optical element 18 into a state of tension. This will ensure accurate alignment and improve the stability of the mounted optical element 18.

The method thus described can be repeated as many times as necessary to mount all the required optical elements. Further, the curing step 204 can be postponed until after all the optical elements are properly mounted and aligned to ensure that the optical signal pathway leads to the output point 40 or similar output.

The invention provides an apparatus and a method for efficiently aligning optical elements of an optical device to ensure proper pathways for optical signals. While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the mounting of optical elements has been described herein, it is to be understood that the mounting structure 103 is applicable for any semiconductor structures which require planar alignment. Further, although the walls 106 are shown in a generally rectangular position, any suitable shape may be employed. Accordingly, the invention is not to be seen as limited by the foregoing description, but is only limited by the scope of the appended claims.

What is claimed as new and desired to be protected by Letters Patent of the United States is:

1. A mounting structure for mounting a semiconductor element, comprising:
    a substrate having a first surface;
    a plurality of protrusions extending from said substrate first surface; and
    one or more walls extending from said substrate first surface and surrounding said protrusions and defining a well, wherein the well is adapted to contain an adhesive material system.

2. The mounting structure of claim 1, further comprising at least one reservoir provided in said substrate and connected with said well to receive said adhesive material system from said well.

3. The mounting structure of claim 2, comprising two said reservoirs.

4. The mounting structure of claim 3, further comprising a pair of conduits, each said conduit connecting a respective said reservoir with said well.

5. The mounting structure of claim 1, wherein said protrusions are configured to receive an optical element.

6. The mounting structure of claim 1, wherein said wails extend above said protrusions.

7. The mounting structure of claim 1, wherein said plurality of protrusions extend by a substantially equal amount from said substrate first surface.

8. The mounting structure of claim 1, wherein the mounting structure is adapted for mounting an optical element.

9. The mounting structure of claim 4, wherein said walls are formed from said substrate.

10. The mounting structure of claim 9, wherein said walls are formed by an anisotropic etch of said substrate.

11. The mounting structure of claim 10, wherein said protrusions are formed from said substrate.

12. The mounting structure of claim 11, wherein said protrusions are formed by an anisotropic etch of said substrate.

13. The mounting structure of claim 12, wherein said reservoirs are formed from said substrate.

14. The mounting structure of claim 13, wherein said reservoirs are formed by an anisotropic etch of said substrate.

15. The mounting structure of claim 14, wherein said conduits are formed from said substrate.

16. The mounting structure of claim 15, wherein said conduits are formed by an anisotropic etch of said substrate.

17. A carrier substrate for use with a plurality of semiconductor elements, comprising:
   a substrate having a first surface; and
   a plurality of mounting structures formed on said substrate each including:
      a plurality of protrusions extending from said substrate first surface; and
      one or more walls extending from said substrate first surface and surrounding said protrusions and defining a well, wherein each said well is adapted to contain an adhesive material system.

18. The carrier substrate of claim 17, further comprising at least one reservoir provided in said substrate connected with each said well to receive said adhesive material system.

19. The carrier substrate of claim 18, comprising two said reservoirs for each said mounting structure.

20. The carrier substrate of claim 19, further comprising a pair of conduits for each said mounting structure, each said conduit connecting a respective said reservoir with each said well.

21. The carrier substrate of claim 17, wherein said protrusions for each mounting structure are configured to receive an optical element.

22. The carrier substrate of claim 17, wherein said walls extend above said protrusions.

23. The carrier substrate of claim 17, wherein said plurality of protrusions extend by a substantially equal amount from said substrate first surface.

24. A semiconductor device, comprising:
   a substrate having a first surface;
   at least one mounting structure including:
      a plurality of protrusions extending from said substrate first surface; and
      one or more walls extending from said substrate first surface and surrounding said protrusions and defining a well; and
   at least one optical element mounted on and adhered to said protrusions.

25. The semiconductor device of claim 24, comprising a plurality of optical elements, each said element mounted on said protrusions of a respective said mounting structure such that each said element is planarly aligned relative to each other said element.

26. The optical device of claim 25, wherein said walls extend above said protrusions.

27. The semiconductor device of claim 24, wherein said plurality of protrusions extend by a substantially equal amount from said substrate first surface.

28. The semiconductor device of claim 26, wherein each said well is adapted to contain an adhesive material system.

29. The semiconductor device of claim 28, wherein said adhesive material system is an epoxy.

30. The semiconductor device of claim 29, wherein each said optical element is mounted on and adhered to said protrusions by said epoxy.

31. The semiconductor device of claim 29, further comprising at least one reservoir provided in said substrate connected with each said well.

32. The semiconductor device of claim 31, comprising two said reservoirs for each said mounting structure.

33. The semiconductor device of claim 32, further comprising a pair of conduits for each said mounting structure, each said conduit connecting a respective said reservoir with each said well.

34. A method of mounting one or more semiconductor elements onto a semiconductor device having one or more mounting structures which include a plurality of protrusions surrounded by one or more walls defining a well, comprising the steps of:
   providing an adhesive material system in said well including at locations above said protrusions;
   lowering said semiconductor element into contact with said adhesive material system;
   contacting said semiconductor element to said protrusions; and
   curing said adhesive material system.

35. The method of claim 34, wherein said adhesive material system is added to a level which extends above said protrusions.

36. The method of claim 34, wherein said curing of the adhesive material system places the semiconductor element in tension.

37. The method of claim 34, wherein said semiconductor element comprises an optical element.

38. A method of planarly aligning two or more semiconductor elements mounted onto a semiconductor device having two or more mounting structures which include a plurality of protrusions surrounded by one or more walls defining a well, comprising the steps of:
   providing an adhesive material system in said well of each said mounting structure including at locations above said protrusions;
   lowering each said semiconductor element into contact with said adhesive material system in a respective said well;
   contacting each said semiconductor element to said protrusions of a respective said mounting structure;
   aligning each said semiconductor element to the other semiconductor elements; and
   curing said adhesive material system.

39. The method of claim 38, wherein said adhesive material system is added to a level which extends above the protrusions.

40. The method of claim 38, wherein said curing of the adhesive material system places each said semiconductor element in tension.

41. The method of claim 38, wherein said semiconductor elements comprise optical elements.

42. The method of claim 41, wherein said semiconductor device comprises an optical device.

* * * * *